(12) United States Patent
Breems et al.

(10) Patent No.: US 8,594,253 B2
(45) Date of Patent: Nov. 26, 2013

(54) JITTER COMPENSATION

(75) Inventors: Lucien Breems, Eindhoven (NL); Robert Rutten, Uden (NL); Robert Henrikus Van Veldhoven, Dommelen (NL)

(73) Assignee: St-Ericsson SA, Plan-les-Ouates (CH)

( * ) Notice: Subject to any disclaimer, the term of this patent is extended or adjusted under 35 U.S.C. 154(b) by 536 days.

(21) Appl. No.: 12/734,635

(22) PCT Filed: Nov. 12, 2008

(86) PCT No.: PCT/EP2008/065381
§ 371 (c)(1),
(2), (4) Date: Apr. 8, 2011

(87) PCT Pub. No.: WO2009/062953
PCT Pub. Date: May 22, 2009

(65) Prior Publication Data
US 2011/0182389 A1    Jul. 28, 2011

(30) Foreign Application Priority Data

Nov. 16, 2007 (EP) .................................. 07120838

(51) Int. Cl.
    *H03D 1/04*    (2006.01)
(52) U.S. Cl.
    USPC ....................................................... 375/346
(58) Field of Classification Search
    USPC ....................................................... 375/346
    See application file for complete search history.

(56) References Cited

U.S. PATENT DOCUMENTS

| 3,099,754 | A | * | 7/1963 | Jones et al. ............... 327/384 |
| 4,179,670 | A | * | 12/1979 | Kingsbury ............... 331/10 |
| 4,599,579 | A | * | 7/1986 | McCann ................. 331/1 R |
| 4,847,864 | A | * | 7/1989 | Cupo ...................... 375/232 |
| 5,036,294 | A | * | 7/1991 | McCaslin ................ 331/1 A |
| 5,666,385 | A | * | 9/1997 | Sullivan et al. ........... 375/296 |
| 6,141,394 | A | * | 10/2000 | Linebarger et al. ....... 375/376 |
| 6,606,583 | B1 |  | 8/2003 | Sternberg et al. |
| 6,795,496 | B1 | * | 9/2004 | Soma et al. .............. 375/226 |

(Continued)

FOREIGN PATENT DOCUMENTS

EP    0 762 702 A1    3/1997

OTHER PUBLICATIONS

Breems, "A 56mW CT quadrature Cascaded ΣΔ Modulator with 77dB in a Near Zero-If 20MHz Band", Proceedings ISSCC 2007, vol. 50, pp. 238-239, Feb. 2007.*

(Continued)

*Primary Examiner* — Juan A Torres
(74) *Attorney, Agent, or Firm* — Coats and Bennett PLLC

(57) ABSTRACT

Circuits and methods for jitter compensation in a receiver system are useful to improve performance. One such circuit includes a combiner block for combining a reference signal with an input signal (Sin) of the circuit, and a converter stage for converting the input signal (Sin) together with the reference signal. The converter stage is clocked by a clock signal modulated by a jitter signal. A forward path having a first mixer unit is provided for multiplying a copy of an output signal (A) of the converter stage with the frequency of the reference signal in order to generate a jitter compensating signal (B). A compensation unit for compensating jitter in the output signal (A) of the converter stage in a direct output path with the jitter compensating signal (B) is also provided.

19 Claims, 10 Drawing Sheets

(56) References Cited

U.S. PATENT DOCUMENTS

| | | | |
|---|---|---|---|
| 7,907,016 B2* | 3/2011 | Eikenbroek | 331/16 |
| 2002/0011901 A1* | 1/2002 | Dinh et al. | 331/17 |
| 2004/0091005 A1* | 5/2004 | Hofmeister et al. | 372/34 |
| 2006/0279441 A1* | 12/2006 | Straussnig et al. | 341/118 |
| 2007/0002964 A1* | 1/2007 | Xu | 375/271 |
| 2007/0002989 A1* | 1/2007 | Song | 375/355 |
| 2008/0055008 A1* | 3/2008 | Staszewski et al. | 331/37 |
| 2008/0191746 A1* | 8/2008 | Friedman et al. | 327/5 |

OTHER PUBLICATIONS

Cherry, "Clock jitter and quantizer metastability in continuous-time delta-sigma modulators", IEEE Transactions on Circuits and Systems II: Analog and Digital Signal Processing, vol. 46, pp. 661-676, Jun. 1999.*

Breems, "A cascaded continuous-time ΣΔ Modulator with 67-dB dynamic range in 10-MHz bandwidth",IEEE Journal of Solid-State Circuits, vol. 39, Issue: 12, Publication Year: 2004, pp. 2152-2160.*

Breems, "Continuous-time Sigma-Delta Modulators for Highly Digitised Receivers" 13th IEEE International Conference on Electronics, Circuits and Systems, 2006, ICECS '06, Publication Year: 2006, pp. 41-45.*

Breems, "A 56 mW Continuous-Time Quadrature Cascaded ΣΔ, Modulator With 77 dB DR in a Near Zero-IF 20 MHz Band "IEEE Journal of Solid-State Circuits, vol. 42, Issue: 12, Publication Year: 2007, pp. 2696-2705.*

Rutten, "Digital jitter-cancellation for narrowband signals" IEEE International Symposium on Circuits and Systems, 2008, ISCAS 2008, Publication Year: 2008, pp. 1444-1447.*

Rutten "Digitial Calibration of a Continous-Time Cascaded ΣΔ Modulator based on Variance Derivative Estimation" Proceedings of the 32nd European Solid-State Circuits Conference, 2006, ESSCIRC 2006, Sep. 19-21, 2006 pp. 199-202.*

International Search Report dated Mar. 25, 2009 in connection with PCT Patent Application No. PCT/EP2008/065381.

Written Opinion of the International Searching Authority dated Mar. 25, 2009 in connection with PCT Patent Application No. PCT/EP2008/065381.

S.L. Jansen, et al., "20-Gb/s OFDM Transmission over 4,160-km SSMF Enabled by RF-Pilot Tone Phase Noise Compensation", Optical Fiber Communication Conference and Exposition and the National Fiber Optic Engineers Conference, OSA Technical Digest Series, Mar. 25, 2007, 3 pages.

Robert van Veldhoven, et al., "The effect of clock jitter on the DR of ΣΔ modulators", 2006 IEEE, p. 2009-2012.

* cited by examiner ional Patent Application No. PCT/EP2008/
JITTER COMPENSATION

CROSS-REFERENCE TO RELATED APPLICATION(S)

The present application claims priority under 35 U.S.C. §365 to International Patent Application No. PCT/EP2008/065381 filed Nov. 12, 2008, entitled "JITTER COMPENSATION". International Patent Application No. PCT/EP2008/065381 claims priority under 35 U.S.C. §365 and/or 35 U.S.C. §119(a) to European Patent Application No. 07120838.3 filed Nov. 16, 2007 and which are incorporated herein by reference into the present disclosure as if fully set forth herein.

FIELD OF THE INVENTION

The present invention relates to a circuit and a method for clock-jitter and mixer-jitter compensation, e.g. for jitter compensation in a frequency band of a receiver for analog or digital modulated signals.

BACKGROUND OF THE INVENTION

Many data-converter systems such as analog-digital-converters (ADCs) use a clock to sample data. This clock is usually prone to clock-jitter, which often limits dynamic range (DR) of such converter systems or converter stages, especially when the DR and the bandwidth of the converter systems are large, as described in R. van Veldhoven, Peter Nuijten, Paul van Zeijl, "The effect of clock jitter on the DR of ΣΔ modulators", *IEEE International Symposium on Circuits and Systems*, May 2006. Another limitation on the DR in a receiver architecture can be the mixer-jitter due to the presence of jitter on the local oscillator (LO) signal at the mixer in a receiver system or in a receiver chain.

In modern radio receivers, such as in a Bluetooth, in an UMTS or in a GSM receiver, the demands on the DR of converter systems, such as ADCs or digital-analog-converters (DACs), become more and more stringent due to the large DR of the signals at the antenna. The performance of an A/D converter or D/A converter highly depends on the quality of the clock. As the invention applies to any type of A/D converter, in the following a sigma-delta (ΣΔ) A/D converter (ΣΔ converter or SDC, for short) is used as specific example. By no means, the invention is limited to ΣΔ A/D converters only. ΣΔ-converters or SDCs are also often referred to as delta-sigma-converters (ΣΔ-converters or DSCs, for short). These ΣΔ-converters or ΣΔ-modulators, respectively, are well-known arrangements that can be used for analog-digital or digital-analog conversion and can be realized as a switched-capacitor converter (SCC, for short) or as a switched-current converter (SIC, for short) and may be used in a receiver architecture.

The DR of ΣΔ-modulators depends e.g. on the jitter characteristics of the applied clock. Phase noise and spurious tones on the clock can limit the DR of sigma-delta ADCs or DACs (ΣΔ ADCs or ΣΔ DACs). So one very important limitation on the achieved performance of ADCs and DACs is the timing inaccuracy or time jitter, respectively, on the clock, with which the ADC or DAC is clocked.

In general the quality of the clock needed for a converter depends on several factors, such as signal dynamics, modulation scheme used in the system, converter topology, frequency of the clock or the oversampling factor, respectively, the ratio of the required signal-to-noise ratio (SNR) or the signal-to-noise-plus-distortion ratio (SNDR) with the bit-error-rate (BER) and the application in which the converter is used.

For sake of clarity, the SNR is defined as the ratio of signal power to the noise power in the signal band. The SNDR indicates in dB the ratio between the powers of the converted main signal and the sum of the noise and the generated harmonics of the signal or spurious components, respectively. The BER, on the other hand, is defined as the number of erroneous bits received divided by the total number of bits transmitted.

New standards with higher data-rates require receivers with ADCs that have larger bandwidths and more DR. A higher DR specification translates to a lower noise level in the ADC, which is mainly determined by circuit noise, quantization noise and noise of the sampling clock. Circuit noise or thermal noise is uncorrelated and can only be reduced by increasing power consumption. Quantization noise can be lowered on an architectural level and is usually not dominant in e.g. SDCs. Contamination of any sampled signal due to clock-jitter is correlated; it can potentially be cancelled by means of digital compensation.

In FIG. 1, taken from J. A. Cherry, W. M. Snelgrove, "Clock jitter and quantizer metastability in continuous-time delta-sigma modulators", IEEE Transactions on Circuits and Systems II: Analog and Digital Signal Processing, vol. 46, pp. 661-676, June 1999, the effect of clock-jitter in an ADC is demonstrated. The left side of the figure shows an analog input spectrum containing several channels, numbered 1 to 5. These channels can be for example modulated carriers in a communication system. The channels are sampled and quantized by an ADC. Due to the jitter of the sampling clock, the channels are contaminated with the same jitter, as illustrated in the right side of FIG. 1. The jitter power around a carrier is linearly proportional with the channel strength and frequency. The example of FIG. 1 also shows that a strong channel (e.g. channel 4) might interfere with a weaker adjacent channel (channel 3 and channel 5), decreasing the quality of these channels, as discussed e.g. in T. Chalvatzis, E. Gagnon and J. S. Wight, "Clock jitter in direct RF and IF sampling wireless receivers", IEE Proceedings-Circuits, Devices and Systems, vol. 153, issue 4, pp. 346-350, August 2006.

In EP 0 228 786 B1 an interference cancellation system for cancellation of an undesired interference signal in a digital radio communication receiver is disclosed. A compensation signal is provided having same amplitude as, and opposite phase to, that of the interference signal included in the desired main signal. The digital radio system shows a first quadrature phase detector for demodulating the main signal and a second quadrature phase detector (or a phase detector) supplied with the same reference carrier and clock signal as that of the first quadrature phase detector, for phase detecting an interference signal. The interference signal is detected and a compensation signal is mixed with the demodulated signal to cancel the interference. However, the disclosed circuit for cancellation of interferences is relatively complicated and does not explicitly deal with compensation of clock-jitter or mixer-jitter in a receiver.

In WO 00/38344 a code division multiple access (CDMA) communication system is shown which has a system for providing a compensation of phase errors caused by clock-jitter in a CDMA reverse link. A compensation factor is applied to samples for determining an adjusted spread data value that compensates for phase errors caused by jitter in an internal clock. This is done in the transmitter of a CDMA communication system.

SUMMARY OF THE INVENTION

It is an object of the present invention to provide compensation of clock-jitter around an output signal of converter systems or converter stages, respectively, as employed in receiver architectures to improve BER and/or SNR performance. Another object of the present invention is to provide compensation of mixer-jitter due to jitter on the signal of a local oscillator for a mixer or mixer unit, respectively, as used in receiver architectures.

At least one of the objects of the present invention is solved by a circuit for jitter compensation.

Accordingly, the circuit comprises: a combiner block for combining a reference signal with an input signal of the circuit; a converter stage for converting the input signal together with the reference signal, the converter stage being clocked by a clock signal; a forward path, particularly a digital forward path in case of an ADC, having a first mixer unit for multiplying a copy of an output signal of the converter stage with a first mixing frequency derived from the reference signal for generating a jitter compensating signal (B); and a compensation unit for compensating jitter in the output signal of the converter stage in a direct output path with the jitter compensating signal.

According to a first basic embodiment the clock signal for the converter stage may be contaminated with jitter, i.e. comprises a first type of jitter signal or in other words, the sample clock signal that is modulated with clock-jitter. Here, the combiner block comprises a first adder unit. The first adder unit is configured to add the reference signal to the input signal, which could be derived from a local oscillator clock signal. The mixing frequency corresponds to the frequency of the reference signal.

According to a second basic embodiment a second mixing frequency used for mixing with the input signal prior the converter stage may be contaminated with jitter, i.e. comprises a second type of jitter signal or in other words, the mixer signal is modulated with jitter which causes mixer-jitter in the mixed input signal. In the second embodiment, the combiner block comprises the adder and a second mixer unit. First, the reference signal is added to the input signal, in an empty frequency band of the input signal. The second mixer unit is configured for multiplying the thereby new composed input signal, i.e. input signal together with the reference signal, with the second mixing signal frequency, which again may be derived from a respective local oscillator clock signal. In the second embodiment, the first mixing frequency corresponds to the second mixing signal frequency reduced or subtracted, respectively, by the predetermined reference frequency, previously was added to the input signal prior mixing.

According to a third basic embodiment, again a second mixing frequency used for mixing the input signal prior the converter stage may be contaminated with jitter, i.e. may cause mixer-jitter in the mixed input signal. Also in the third embodiment the second mixing signal frequency may be derived from a respective local oscillator clock signal. In the third embodiment, the combiner block of the first embodiment further comprises the second mixer unit, which is now arranged prior the first adder unit. The second mixer unit is configured for multiplying the input signal with the second mixing signal frequency, e.g. generated by the respective local oscillator clock signal. The first adder unit is again configured to add the reference signal to the input signal, but the reference signal is now derived from the second mixing signal, e.g. by means of a divider unit configured for dividing the second mixing signal frequency by a predetermined factor.

Further, at least one of the objects is solved by a method for jitter compensation in accordance with claim 14.

Accordingly, the method comprises the steps: combining a reference signal with an input signal (Sin) to be converted; converting said input signal together with said reference signal thereby obtaining an output signal; multiplying a copy of said output signal with a first mixing frequency derived from said reference signal for generating a jitter compensating signal; and compensating jitter in said output signal with said jitter compensating signal.

In the method in accordance with the first embodiment combining comprises generating said reference signal; and adding said reference signal to said input signal; wherein said mixing frequency corresponds to the reference signal frequency.

In the method in accordance with the second embodiment combining further comprises, after adding said reference signal to said input signal, multiplying said input signal with a second mixing signal frequency; deriving said first mixing frequency by reducing the second mixing signal frequency by the reference signal frequency.

In the method in accordance with the third embodiment combining further comprises prior said adding said reference signal to said input signal, multiplying said input signal with a second mixing signal frequency; and deriving said reference signal from said second mixing signal frequency by dividing the second mixing signal frequency by a predetermined factor.

The invention has general applicability in the field of signal processing. Particular useful is the application in receiver architectures that may comprise a receiver chain for analog and/or digital signals. Thus, the circuit and method can be applied in receiver architectures and they are especially useful for improving the SNR or BER performance. Such a receiver architecture may comprise e.g. a receiver for analog modulated signals like an AM/FM radio broadcast receiver or a receiver for digitally modulated signals like a Bluetooth, a GSM, an UMTS or any other type of communication receiver of digital standards.

The basic idea is to use a jitter signal, which is present around a known signal, such as a clean reference signal, to compensate for jitter around a desired signal, which desired signal is usually unknown, at a different frequency position in a complex signal spectrum. Accordingly, a reference signal is introduced in the input signal path, or an already present signal which is introduced e.g. by a mixer operation, will be contaminated with jitter by purpose. Then, the reference signal or a signal derived from the reference signal can be used to extract the jitter content for generation of a suitable jitter compensation signal.

Finally, the extracted jitter content (jitter signal) can be used to compensate for jitter around a different frequency in the signal spectrum.

Both, the circuit and the method, share the same advantages. Some advantages are listed below and will also be described in more detail in connection with the embodiments of the present invention.

By implementing the circuit or applying the method for jitter compensation in a receiver system or in a receiver chain, also DR can be improved and thus the sensitivity of these systems can increase.

Processing time expenses for the application of the method are convenient due to the presence of fast digital hardware, nowadays. Even on low-end digital signal processors (DSPs) the method can still be applied.

By applying the inventive method to derive a clearer signal, which is almost free from jitter, the whole signal information content is still present and not corrupted or distorted. The inventive concept can be applied to any type of A/D or D/A converters, regardless of their specific implementations.

The method can easily be carried out on an input signal ysig in an arbitrary frequency band as long as the reference signal including the jitter signal that is to be compensated for is not being interfered with another signal, i.e. the reference signal is located in a 'clean' part of the (complex) signal spectrum. The term "clean" also relates to the fact that the reference signal is disturbed only by the clock jitter and not by any other noise source, in a way that the reference tone can clearly be distinguished from other signal and jitter components in the signal spectrum. The term "mixer-jitter" corresponds basically also to clock-jitter but merely indicating the location where the jitter comes from, i.e. in this case it is the jitter on the LO clock and not the jitter on the ADC clock as in case of using the term "clock-jitter".

It is to be noted that the circuit can also be realized with some minor modifications of circuit elements or circuit units used, dependent on the application, the desired frequency range and other specifications.

It should be noted that the jitter signal might be a sinusoidal jitter signal, a Gaussian-distributed jitter signal or any other kind of jitter signal. Further, the jitter signal may have a band-limited (coloured) or unlimited (white) frequency range. In other words, the shape of the jitter signal is not essential for the present invention. Moreover, the jitter signal can also be a combination of several jitter signals, in particular stemming from different sources, e.g. a first jitter signal may be due to clock-jitter and a second jitter signal may be due to mixer-jitter. A person skilled in the art will surely find equivalent other ways to carry out the inventive method.

Preferred embodiments of the invention are defined in the dependent claims.

It shall be understood that the circuit and the method of the present invention have similar and/or identical preferred embodiments as defined in the dependent claims.

BRIEF DESCRIPTION OF THE DRAWINGS

These and other aspects of the invention will be apparent from and elucidated with reference to the embodiments described hereinafter. In the following drawings.

DETAILED DESCRIPTION OF EMBODIMENTS

In the following the basic concept of a novel approach for clock jitter and mixer-jitter cancellation will be discussed. A compensation signal is composed by deriving the spectral content of a signal $y_{ref}$. This sampled reference signal $y_{ref}$ is a sinusoid with known frequency $\omega_{ref}$. This signal has been sampled with the jittered clock and subsequently quantized by an ADC that also digitizes the desired input signal. For this analysis, the clock-jitter is assumed to be sinusoidal. It can be shown that one signal tone or reference tone at frequency $\omega_{ref}$, which is sampled with a jittered clock or clock-jitter, respectively, equals:

$$y_{ref} = e^{-j\omega_{ref}(t+\Delta t \cdot T_s \sin(\omega_m t))}, \quad (1)$$

where $\omega_m$ is the clock-jitter modulation frequency, $T_s$ is the sampling time and $\Delta t$ is the modulation amplitude. In equation (1), the parameter t denotes the time and $y_{ref}$ represents a reference signal, which will be used to compensate the clock-jitter in a desired main signal.

This is done by an analysis of the clock-jitter in this reference signal, which is in a different frequency range than the desired main signal. The analysis of the reference signal is now going to be described in more detail.

Rewriting the sinus function in equation (1) by using its basic relation with the complex exponential function, yields:

$$y_{ref} = e^{-j\omega_{ref} t} e^{-j\omega_{ref} \Delta t T_s \frac{e^{j\omega_m t} - e^{-j\omega_m t}}{2j}}. \quad (2)$$

When $\Delta t$ is small, the second exponential function in equation (2) can be approximated by a Taylor approximation of first order, i.e. $e^x \approx 1+x$ for small x. Hence, this yields equation (3):

$$y_{ref} \approx e^{-j\omega_{ref} t}\left(1 - j\omega_{ref}\Delta t \cdot T_s \frac{e^{j\omega_m t} - e^{-j\omega_m t}}{2j}\right). \quad (3)$$

For sake of simplification, this approach does not take the higher Bessel components into account that result from the modulation used. However, this approach results in an analytic expression, which is reasonable and has proved to be in accordance with experimental results to reflect the impact of the clock-jitter on the complex signal spectrum.

After a few simple mathematical steps, one obtains, finally, from equation (3):

$$y_{ref} \approx e^{-j\omega_{ref} t} + \omega_{ref}\frac{T_s}{2}\cdot \Delta t \cdot e^{-j(\omega_{ref}+\omega_m)t} - \omega_{ref}\frac{T_s}{2}\cdot \Delta t \cdot e^{-j(\omega_{ref}-\omega_m)t}. \quad (4)$$

Figure 1:
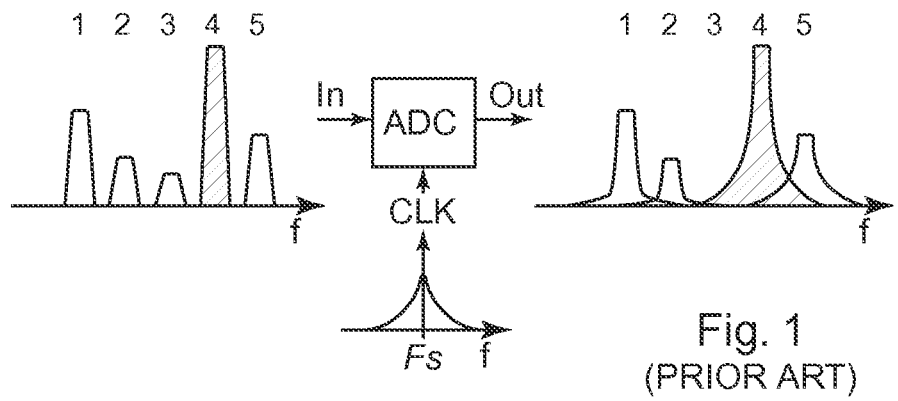
FIG. 1 illustrates the channel quality degradation due to jitter contamination in an ADC.
Figure 2:
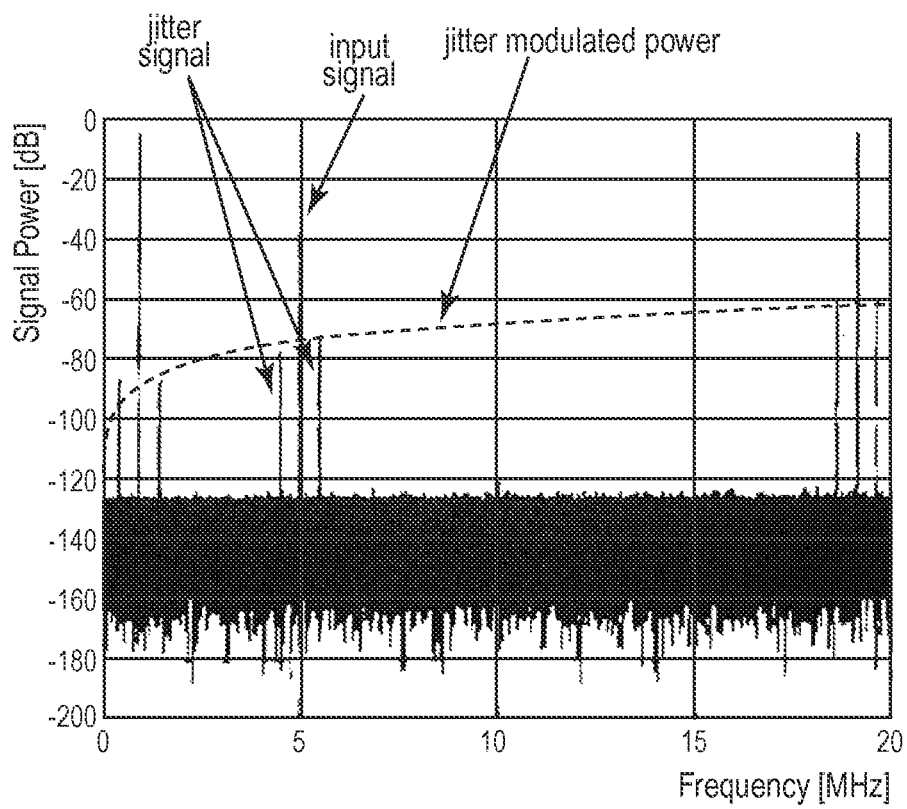
FIG. 2 depicts the clock jitter power versus frequency for three tones with frequencies 1 MHz, 5 MHz and 19 MHz, where the dashed line indicates the power of the jitter components around the tones.

To sum up, equation (4) shows the impact of clock contamination on the shape of the signal, in this embodiment this is the reference signal $y_{ref}$. However, equation (4) does not show the impact of clock contamination on the signal gain. For illustration, FIG. 2 shows a graph of three tones with frequencies 1 MHz, 5 MHz and 19 MHz, respectively, and showing the same amplitude. The signal power, i.e. the clock jitter energy, is plotted versus frequency. These signals are sampled with a clock that is frequency modulated with a 500 kHz sinusoid. The dashed line indicates the power of the jitter components around the tones. The jitter power increases with frequency at 20 dB/dec. The inventors have found that the same jitter occurs around each carrier and thus this gives the opportunity to measure the jitter around a reference tone which can be used to compensate for jitter contamination elsewhere in the band.

Figure 3:
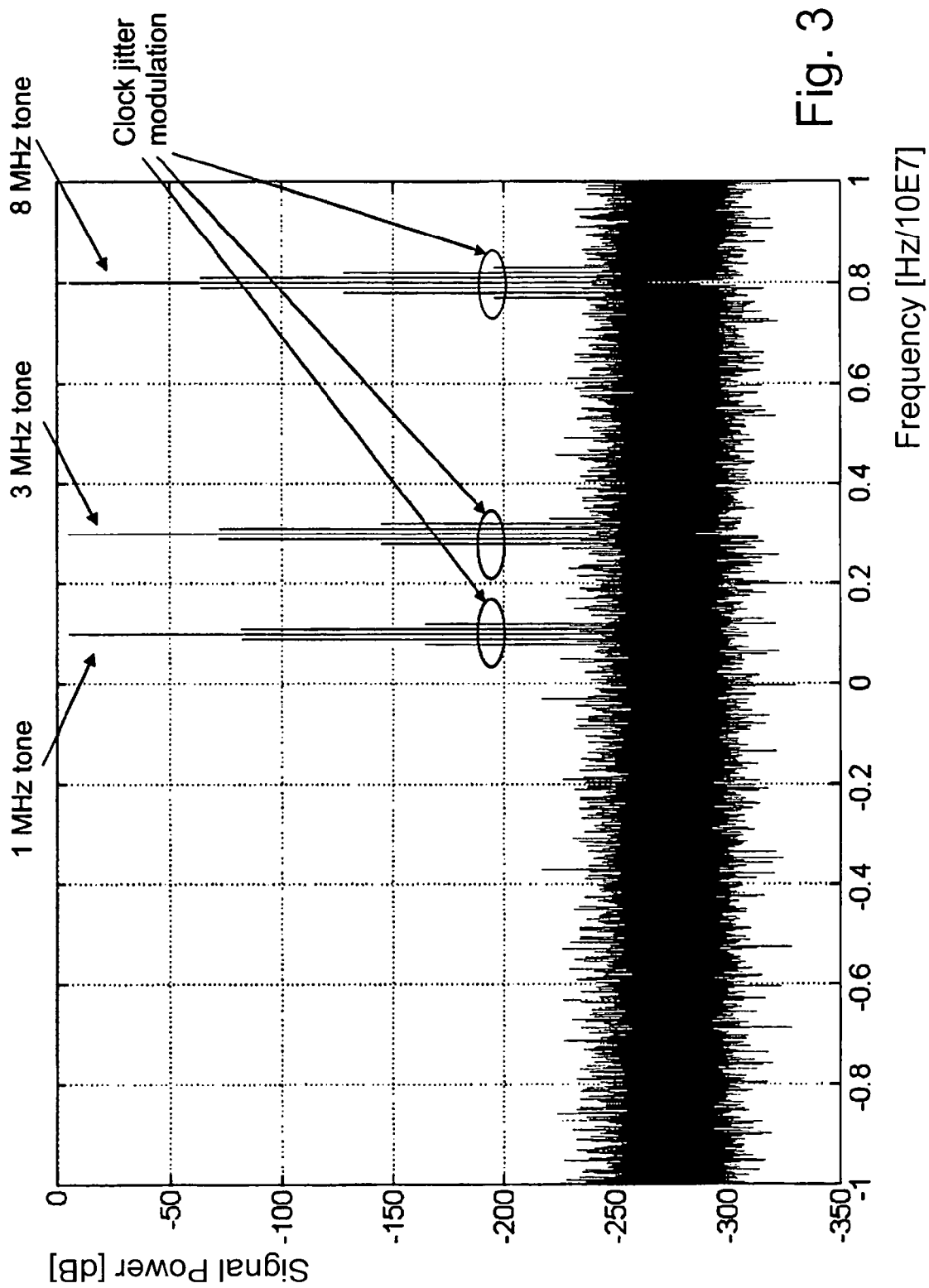
FIG. 3 shows a complex signal spectrum of three signal tones (1 MHz, 3 MHz, 8 MHz), sampled with a clock with sinusoidal clock-jitter.

Now, an analysis of the impact of clock-jitter on the complex signal spectrum is described. According to an embodiment of the present invention, FIG. 3 shows the impact of clock-jitter in a sampling system or in a converter system, respectively. The complex signal spectrum consists of three signal tones, indicated as 1 MHz, 3 MHz and 8 MHz, sampled with a sinusoidal jittered clock or sinusoidal clock-jitter, respectively. In FIG. 3 the magnitude of the complex signal power is plotted in dB over the signal frequency in Hz. In this embodiment the sinusoidal clock-jitter is assumed to show a frequency of 100 kHz and an amplitude of 0.1% of the nominal clock period. It goes without saying that higher input signal frequencies suffer more from clock-jitter than smaller input signal frequencies, as described, for instance, in R. van Veldhoven, Peter Nuijten, Paul van Zeijl, "The effect of clock jitter on the DR of ΣΔ modulators", *IEEE International Symposium on Circuits and Systems*, May 2006.

Referring to FIG. 3, the 1 MHz and 3 MHz signal tones are assumed to carry relevant information, whilst the 8 MHz tone is considered as a reference signal. According to the basic idea, the clock jitter on the reference signal will be used to compensate the clock-jitter around another signal or signal tone, respectively, e.g. around the 1 MHz and/or 3 MHz signal tones. That is, the other signal is in another frequency range (or sub-band) than the analyzed reference signal. This concept will be explained in more detail below.

As FIG. 3 illustrates the shape of the jitter-contamination of the signal is equal for each signal tone in the complex signal spectrum as this jitter shows itself in the sharp side peaks of the signal tones equally spaced at multiple distances of 100 kHz, representing the sinusoidal jitter frequency. The magnitude of these side-peaks decreases with decreasing frequency and strength of the signal tone. Based on the example of FIG. 3, the use of the above-described clock contamination of one clean reference tone in order to improve the compensation of the jitter contamination for a signal tone is explained in more detail. This is done with reference to FIGS. 4 to 6.

Referring back to FIG. 3, where the tones at 1 MHz and 3 MHz have been assumed to be signal tones, while the 8 MHz signal (tone) represents a reference tone or reference signal, respectively, it will be shown that the time jitter introduced around this reference tone can be used for compensation of the time jitter on the signal tones or signals, respectively.

Figure 4:
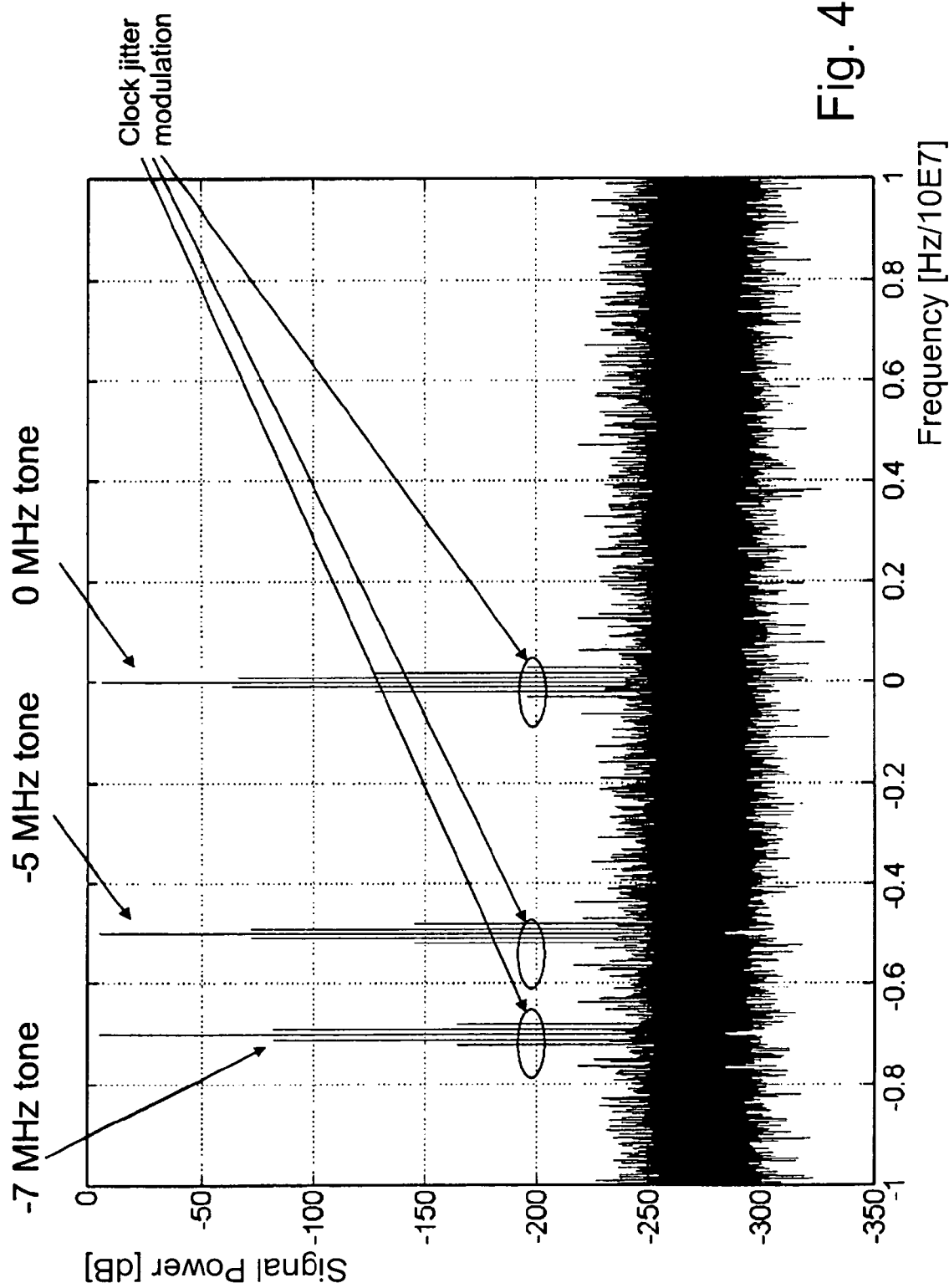
FIG. 4 shows a complex signal spectrum of the three frequency-shifted signal tones (−7 MHz, −5 MHz, 0 MHz) of FIG. 3, which are shifted by 8 MHz to lower frequencies in order to obtain a zero-intermediate frequency (zero-IF) for the reference tone.

Therefore the reference signal is mixed, i.e. shifted to e.g. zero-intermediate frequency (zero-IF) e.g. by means of a mixer unit such as a digital mixer. The resulting complex signal spectrum is shown in FIG. 4, which also illustrates the impact of the higher order, Bessel components, also referred to as side peaks, on the spectrum. In FIG. 4, where the signal tones are shifted by 8 MHz to lower frequencies in order to obtain a zero-IF for the reference tone (the 1 MHz and 3 MHz tones are shifted to the −7 MHz and −5 MHz tones, respectively), the jitter signal information is still present. That is, the jitter signal can be filtered out with a filter stage comprising e.g. a low-pass filter in this case. Any other appropriate filter dependent on the frequency range or any other desired specification could be implemented as well. The resulting signal contains all the clock-jitter information and can be used in further steps to improve the suppression or the compensation of jitter on the desired signal that can be in a different frequency band in the receiver architecture.

To underline the concept described, the mathematical approach will be given in the following. The reference signal $y_{ref}$ of equation (4) is multiplied by $e^{j\omega t}$, where the signal frequency $\omega$ equals the frequency $\omega_{ref}$ of the reference signal $y_{ref}$ in this embodiment, resulting in equation (5) for the mixed signal $y_{mix}$:

$$y_{mix} \approx 1 + \omega_{ref} \cdot \frac{T_s}{2} \cdot \Delta t \cdot e^{-j\omega_m t} - \omega_{ref} \cdot \frac{T_s}{2} \cdot \Delta t \cdot e^{+j\omega_m t}. \quad (5)$$

In FIG. 4 and in equation (5), respectively, the DC information (i.e. the first term, namely the constant 1, in equation (5)) is not part of the jitter-information and thus is blocked or eliminated, respectively, in this frequency shifted signal resulting in the compensating signal $y_{comp}$:

$$y_{comp} \approx \omega_{ref} \cdot \frac{T_s}{2} \cdot \Delta t \cdot e^{-j\omega_m t} - \omega_{ref} \cdot \frac{T_s}{2} \cdot \Delta t \cdot e^{+j\omega_m t}. \quad (6)$$

Figure 5:
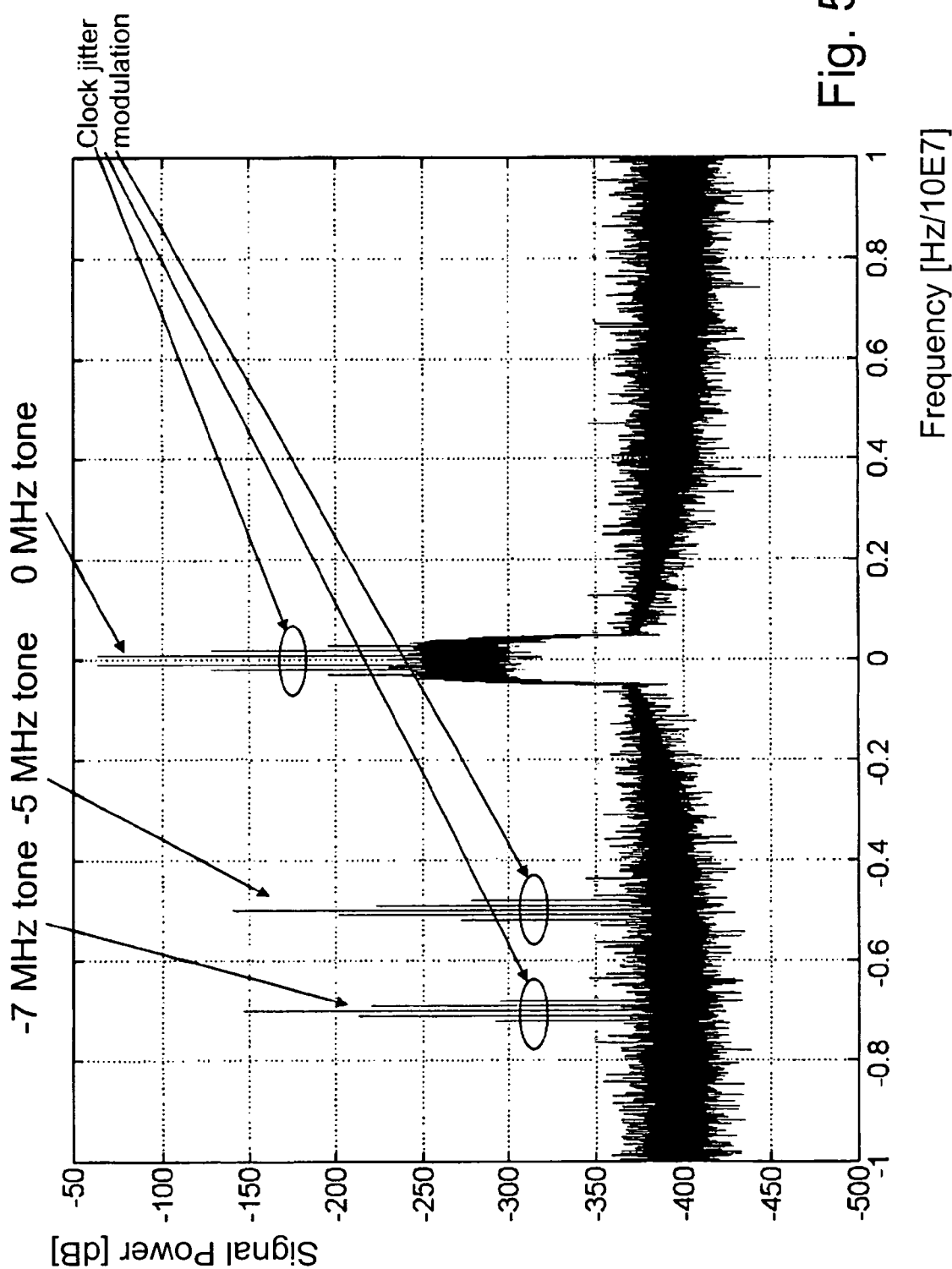
FIG. 5 shows a complex signal spectrum of the three low-pass filtered and frequency-shifted signal tones (−7 MHz, −5 MHz, 0 MHz) of FIG. 4, in which the DC part of the reference signal is blocked or eliminated, respectively.

The complex signal spectrum of the low-pass filtered frequency shifted jitter signal of FIG. 4, in which the DC part of the reference signal is blocked, is shown in FIG. 5.

This signal is referred to as compensating signal $y_{comp}$ as illustrated in FIG. 5. It is noted that DR has increased in this step (cf. noise floor in FIG. 5 with noise floor in FIGS. 3 and 4), which is due to the filtering action. The noise floor in the stop band of the applied filter has dropped leading to an increase in DR.

In a further step, the jitter-contaminated signals of FIG. 3 can be divided by this jitter-signal or compensating signal, respectively, of FIG. 5 to suppress the jitter content. Thus, one can obtain a clearer signal since the jitter will nearly have been completely compensated or suppressed, respectively, in the jitter compensated spectrum (jitter suppressed spectrum). A mathematical verification will be described in the following.

One of the signal tones with frequency $\omega_{sig}$ in the spectrum of FIG. 3 can be approximated in the same manner as described above in case of the reference signal (see equations (1) to (4)) and in case that the clock-jitter is assumed to be sinusoidal. Therefore, one obtains similarly to equation (4) for the reference signal $y_{ref}$, the following expression for the signal $y_{sig}$:

$$y_{sig} = e^{-j\omega_{sig} t} + \omega_{sig} \cdot \frac{T_s}{2} \cdot \Delta t \cdot e^{-j(\omega_{sig} + \omega_m)t} - \omega_{sig} \cdot \frac{T_s}{2} \cdot \Delta t \cdot e^{-j(\omega_{sig} - \omega_m)t}. \quad (7)$$

As equation (7) shows, the signal $y_{sig}$ suffers from the same clock-jitter compared to the reference signal $y_{ref}$. However, the amplitude of the distortion is different. When the center frequency, such as the carrier frequency, is known, this amplitude mismatch can be calculated and thus the clock-jitter components around the signal frequency $\omega_{sig}$ can be suppressed. The difference in the amplitude of the distortion between signal and reference distortion can be adjusted by a factor G derived as the ratio of the signal frequency $\omega_{sig}$ and the reference frequency $\omega_{ref}$. This factor G $$G = \frac{\omega_{sig}}{\omega_{ref}} \quad (8)$$

corresponds to the (signal) gain. Accordingly, the clock-jitter compensation can be performed in accordance to the following formula to obtain the resulting compensated signal $y_{result}$:

$$y_{result} = \frac{y_{sig}}{C + G \cdot y_{comp}}, \quad (9)$$

where G is given by equation (8) and $y_{sig}$ and $y_{comp}$ denote the signal and the compensating signal, respectively, which were given by equations (7) and (6). The factor C in the denominator of equation (9) equals the DC value that is extracted from the reference signal $y_{ref}$. C can be estimated or calculated by a DC blocking unit or a DC estimator, respectively. In other words, C accounts for the change in the DC offset of the reference signal and can be regarded as a correction factor.

Substituting equations (6) to (8) into equation (9) yields the resulting compensated signal $y_{result}$:

$$y_{result} \approx \frac{e^{-j\omega_{sig}t} - \omega_{sig} \cdot \frac{T_s}{2} \cdot \Delta t \cdot}{1 - \omega_{sig} \cdot \frac{T_s}{2} \cdot \Delta t \cdot e^{+j\omega_m t} + \omega_{sig} \cdot \frac{T_s}{2} \cdot \Delta t \cdot e^{-j\omega_m t}} \quad (10)$$

For small input signal frequencies $\omega_{sig}$ equation (10) can further be simplified as:

$$y_{result} \approx e^{-j\omega_{sig}t}, \quad (11)$$

which corresponds to the wanted (main) signal, i.e. the resulting compensated signal.

Figure 6:
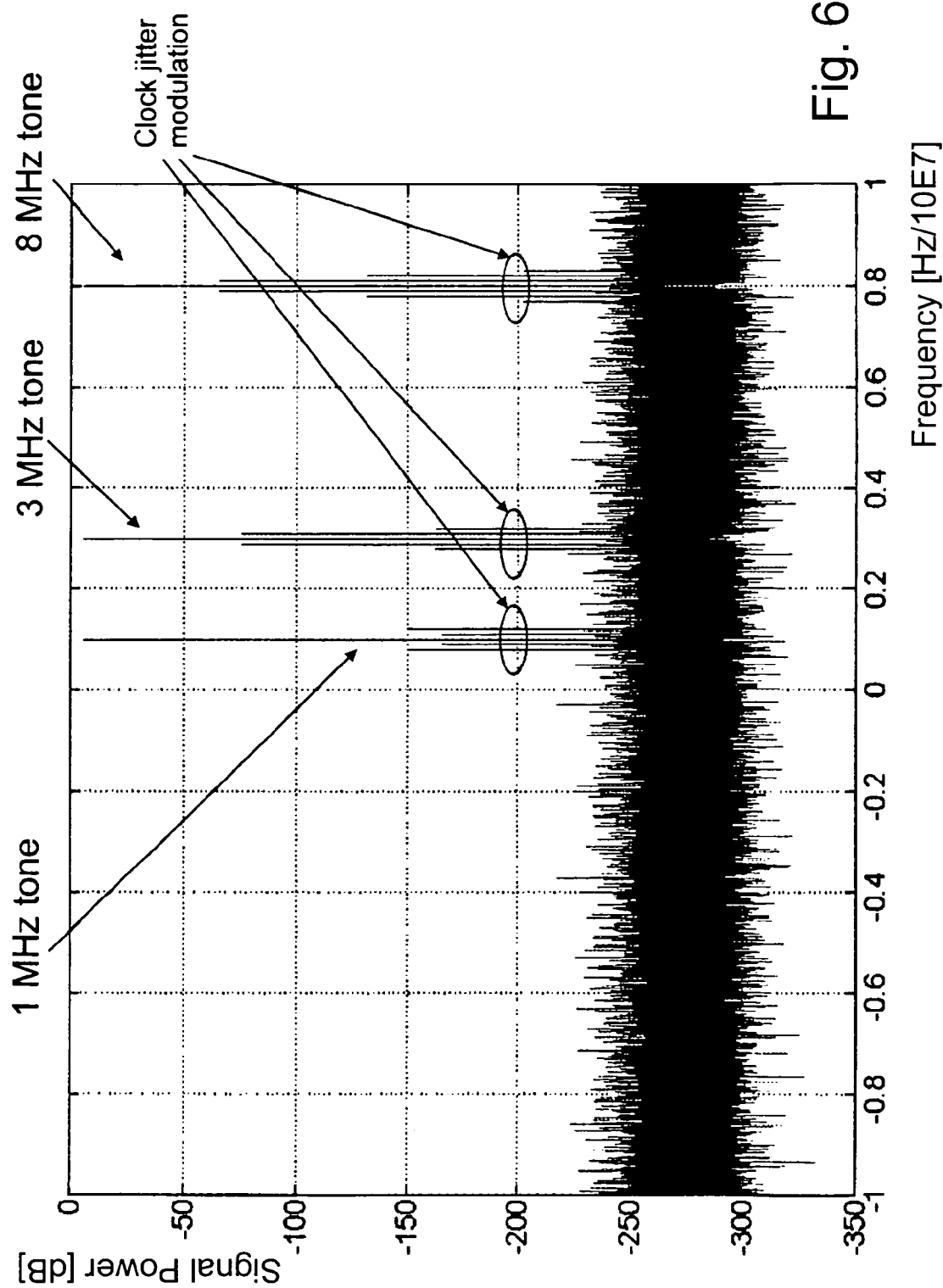
FIG. 6 shows the compensated complex signal spectrum for the three signal tones (1 MHz, 3 MHz, 8 MHz) of FIG. 3.

FIG. 6 illustrates the compensated complex signal spectrum for the three signal tones (1 MHz, 3 MHz, 8 MHz) of FIG. 3. The reduction of the side peaks or side-tones, respectively, can clearly be seen when comparing to FIG. 3. It is noted that the gain G is optimized for the band around 1 MHz in this embodiment.

With respect to FIG. 6, the first order distortion on the 1 MHz tone is suppressed by a value of about 74 dB. The 3 MHz tone is less suppressed, because the gain G for this signal frequency is slightly higher and thus the resulting compensated signal $y_{result}$ more damped at the 3 MHz tone than at the 1 MHz tone according to equations (9) and (10). However, once this gain is adapted for optimal compensation or suppression, respectively, of the clock jitter at the 3 MHz tone, then the jitter-suppression would also amount to about 74 dB at this frequency. Additionally, the pass-band ripple of the low-pass filter used may limit the clock jitter suppression. Nevertheless, by choosing an appropriate filter stage comprising e.g. a different filter or a combination thereof, the influence on clock-jitter suppression can be minimized. The suppression can be improved e.g. by simply decreasing the pass-band ripple of the low-pass filter. However, in this case the higher order Bessel components (side peaks) stemming from the inherent phase modulation become dominant.

Figure 7:
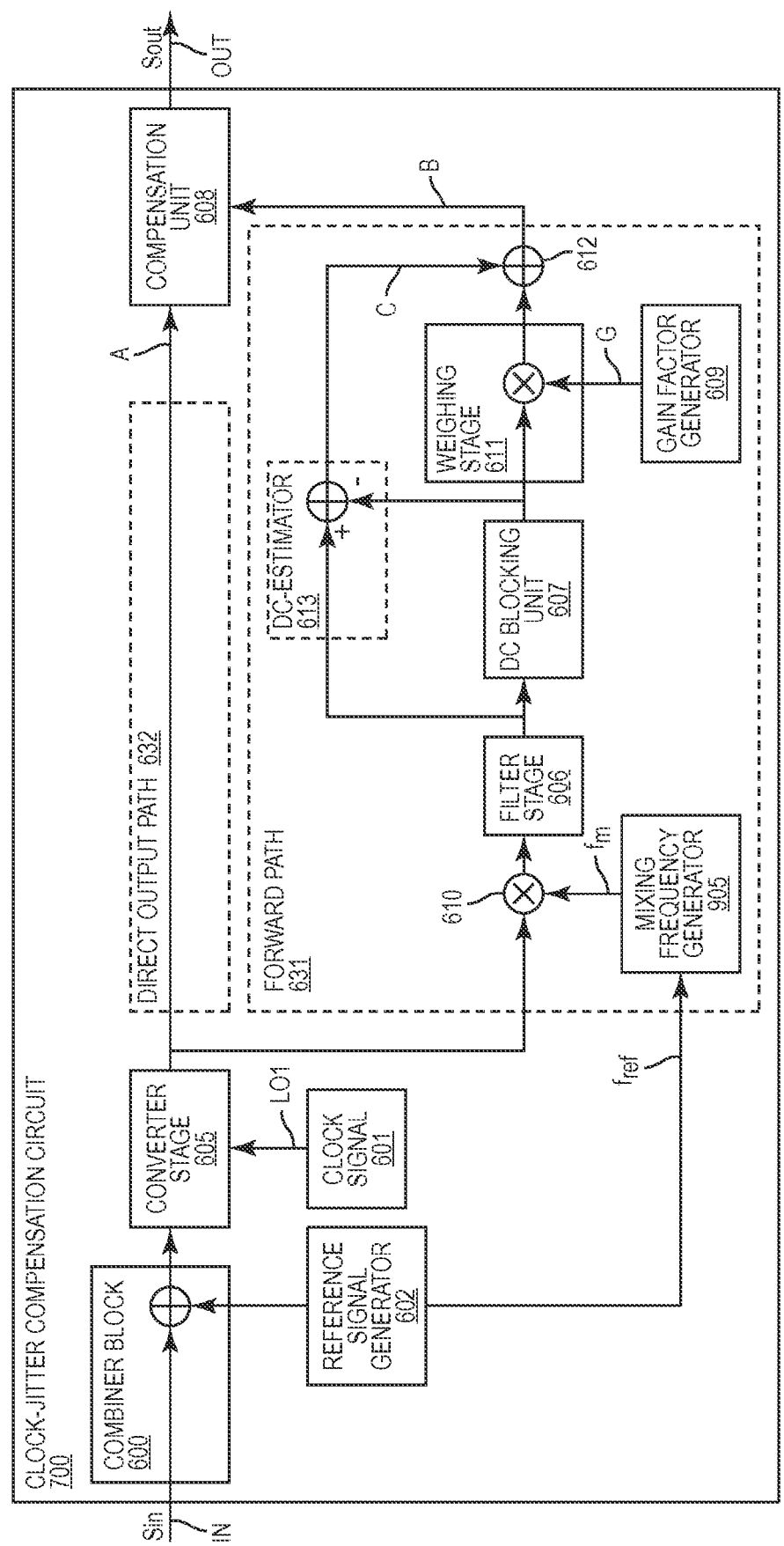
FIG. 7 shows a clock-jitter compensation circuit schematic according to a first embodiment of the present invention.

It is worth noting that the possibility exists to achieve the same performance when the filtering is done before mixing the signal with the reference signal. In such a case an appropriate band-pass filter may be chosen instead of the low-pass-filter used or a combination thereof. In FIG. 7 a first embodiment for a circuit 700 with jitter compensation is depicted. A reference signal generator 602, e.g. a local oscillator, generates a reference signal with frequency fref. The reference signal is added by a combiner block 600 to the input signal Sin comprising a characteristic signal frequency fsig in a sub band, e.g. a signal channel, of interest. The input signal Sin is supplied at the input IN. In this embodiment the combiner block 600 comprises a first adder unit 603.

The following converter stage 605 comprises a converter, e.g. an ADC, which samples at a certain clock that is assumed to be contaminated with jitter (i.e. clock-jitter). The converter stage 605 is clocked by a clock signal 601 that comprises a first jitter signal, i.e. that is modulated with a clock-jitter signal.

The output signal A of the converter stage 605, in case of an ADC, is a digital signal and is branched or divided into a direct output path 632 and a forward path 631. In the forward path 631 a copy of the output signal A is first mixed or multiplied by a first mixer unit 610 with a mixing frequency fm, which is derived by means of a unit 905 for generating the mixing frequency. In this embodiment the mixing frequency fm corresponds to the nominal frequency of the reference signal fref.

Then, subsequently the multiplied copy of output signal A of the converter stage 605 is filtered in a filter stage 606 comprising filter elements such as a low-pass filter with a suitable bandwidth for extracting the jitter content from the copy of the output signal A, which has been shifted down e.g. to zero-ZF by mixing with the mixing frequency fm.

Next, by means of a DC blocking unit 607 a direct portion in the signal corresponding to the downshifted reference frequency is eliminated. Further, the jitter content is adjusted by means of a weighting stage 611 for signal gain adjustment by means of a gain factor G that is provided by gain factor generator 609.

Subsequently, a second adder unit 612 adds an estimated DC value C. The estimated DC-value is generated by means of a DC-estimator 613, which, in this embodiment, estimates the DC-value as a difference between the signals before and after the DC blocking unit 607. In other words, the DC value C is obtained by adding the signal coming from the filter stage 606 with the inverted signal from the DC blocking unit 607 with a third adder unit 613. It is worth noting that also any other suitable approach for estimating the DC-value may be used. The sum of the weighted jitter content and the estimated DC value C results in the compensating signal B.

The output signal A in the direct output path of the converter stage 605 is then compensated with the compensating signal B. The jitter compensation is made in a compensation unit 608, in which the direct output path signal A is divided by the compensating signal B such that a jitter compensated signal is obtained as the output signal $S_{out}$ at the output OUT of the circuit. In the ideal case, the output signal at the output OUT is completely free from clock-jitter.

In another embodiment of the present invention simulation results based on Gaussian-distributed clock-jitter are discussed. So the clock jitter is not assumed to be sinusoidal any more like in the previous embodiments. Thus, in the following only simulation results are discussed which are reasonable to show the impact of Gaussian-distributed clock-jitter on the complex signal spectrum.

Figure 8:
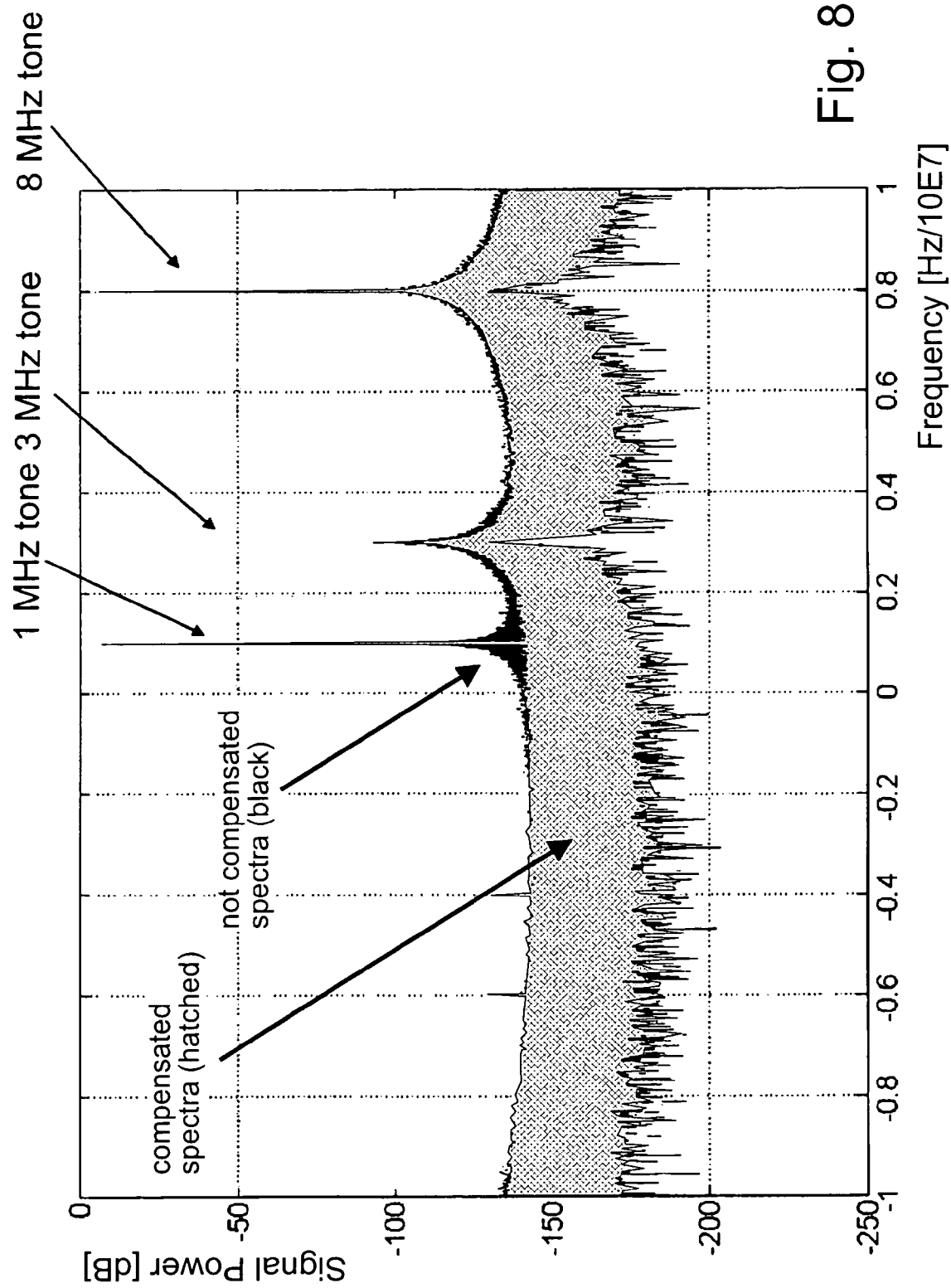
FIG. 8 shows a complex signal spectrum of three signal tones (1 MHz, 3 MHz, 8 MHz) with Gaussian-distributed clock-jitter before (indicated as not compensated spectra in black color) and after compensation (indicated as compensated spectra in grey color) according to an embodiment of the present invention.

FIG. 8 shows the complex signal spectrum in case of Gaussian-distributed clock-jitter for three signal tones (1 MHz, 3 MHz, 8 MHz). The complex signal spectrum before (indicated as not compensated spectra, see black traces) and after compensation (indicated as compensated spectra, see grey traces) is shown when applying the processing steps as will be described in connection with FIG. 11. Each signal tone shows certain 'side-lobs', which strongly depends on the tone-frequency and on the signal amplitude. After the compensation method has been applied on the illustrated original spectrum (black spectra), i.e. the gain G has been adapted for a tone or frequency of 1 MHz, the SNDR could be improved by 40 dB in a bandwidth of 200 kHz around the tone-frequency of 1 MHz.

In a further development of the present invention a compensation circuit schematic is presented which is able to compensate for jitter, which has been introduced by so-called mixer-jitter. In this respect, in a receiver circuit, typically a mixer unit mixes or multiplies a local oscillator (LO) clock frequency with the input signal of the receiver. The local oscillator (LO) clock may be contaminated with jitter. Accordingly, the output signal of the mixer $y_{mixO}$ contains the product of the input signal $y_{sig}$ (cp. equation (11))

$$y_{sig} \approx e^{j\omega_{sig}t}, \quad (12)$$

with the LO signal of the mixer $y_{mix}$ that is contaminated with jitter (cp. equation (1)):

$$y_{mix} \approx e^{-j\omega_{LO}(t+\Delta t \cdot T_s \sin(\omega_m t))}, \quad (13)$$

and thus the output signal of the mixer $y_{mixO}$ is given by:

$$y_{mixO} \approx e^{j\omega_{sig}t} \cdot e^{-j\omega_{LO}(t+\Delta t \cdot T_s \sin(\omega_m t))}. \quad (14)$$

Rewriting equation (14) in a similar way as for equations (4), (5) and (7), yields:

$$y_{minO} \approx e^{-j(\omega_{LO}-\omega_{sig})t} + \quad (15)$$
$$\omega_{LO}\frac{T_s}{2}\cdot \Delta t \cdot e^{-j(\omega_{LO}-\omega_{sig}+\omega_m)t} - \omega_{LO}\frac{T_s}{2}\cdot \Delta t \cdot e^{-j(\omega_{LO}-\omega_{sig}-\omega_m)t}.$$

It is worth noting that the mixing operation cannot suppress or compensate the clock-jitter by the ratio of the mixer frequency and the signal frequency, as it is the case for analog-digital-conversion. Hence, such mixer-jitter must be considered separately. Further, the distance between the signal level and the jitter level in the mixer output signal corresponds to the distance between the LO level and the jitter level. It is worth saying that this distance is independent on the input signal and LO frequency, respectively, at the mixer unit.

In a second embodiment, jitter of the local oscillator (LO) clock for a mixer, which may be an analog or digital mixer, of a receiver, will be compensated by applying a similar procedure as in the above described jitter compensation schematic of FIG. 7. The down-mixed input signal contaminated with jitter, i.e. the clock-jitter from the LO, is sampled and digitised by the converter system 605, e.g. by an ADC. Subsequently the clock-jitter compensation is applied as in circuit schematic as shown in FIG. 7. The detailed mixer-jitter compensation circuit schematic is shown in FIG. 9.

Figure 9:
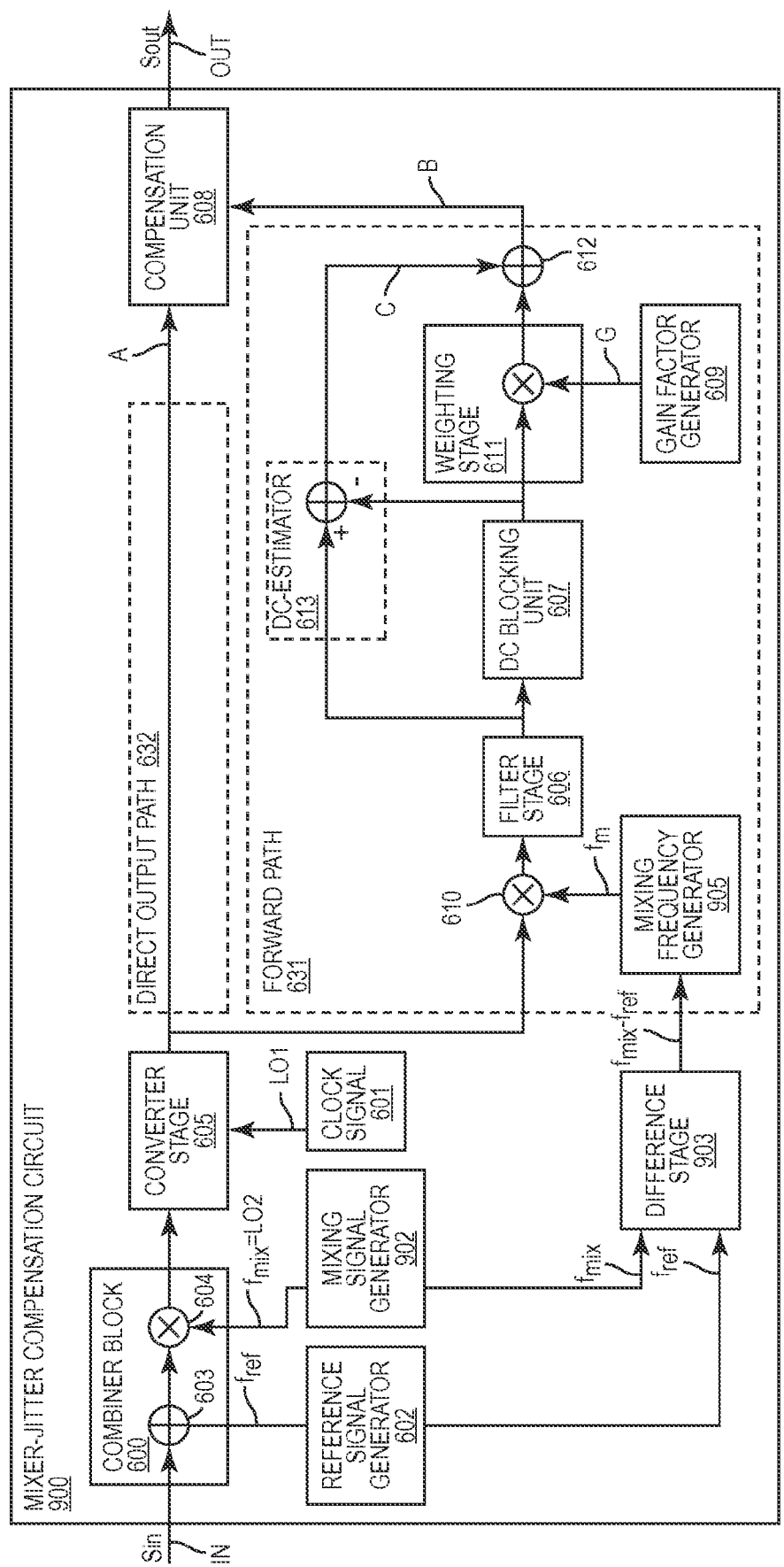
FIG. 9 shows a mixer-jitter compensation circuit schematic according to a second embodiment of the present invention.

Basically, the circuit 900 in FIG. 9 is based on the circuit as shown in FIG. 7 but has a few differences. In FIG. 9 the reference signal generator 602, e.g. a local oscillator (LO) clock, generates the reference frequency fref and supplies the reference signal to the adder unit 603. Further, a mixing signal generator 902 generates a second mixing signal, which may be contaminated with jitter. The combiner block 600 further comprises a second mixer unit 604. The "new" composed input signal, i.e. comprising the input signal $S_{in}$ and the reference signal is then multiplied or mixed, respectively, in the combiner block 600 with the second mixing signal frequency by means of a second mixer 604. The converter system 605 again samples at a clock frequency of a clock LO1 indicated as 601 in FIG. 9. The output A of the converter stage 605 is directed to the forward path 631 of the circuit where it is processed in a similar way as in FIG. 7.

As a major difference to the embodiment of FIG. 7, the copy of the output signal A in the forward path 631 is multiplied with a mixing frequency fm, which is derived from the reference signal frequency fref and the second mixing frequency fmix. In this embodiment, the mixing frequency fm corresponds to the difference of the second mixing frequency and the reference frequency fref, i.e. fm=fmix−fref=LO2−fref. This difference is provided by the difference stage 903. The further circuit units correspond to the circuit units described in connection with the embodiment of FIG. 7.

However, in the gain adjustment the processed jitter content signal is multiplied with a signal gain G=1, i.e. with a constant factor 1. In other words, no gain adjustment is performed. Then, the direct output A of the converter stage 605 is compensated by means of a compensation unit 608 with the mixer jitter compensation signal B that is the output of the forward path 631 of this circuit.

The embodiment of FIG. 9 requires a clean RF input reference signal to measure the mixer-jitter of the mixer LO signal. Further, the converter may also add jitter from its clock (clock-jitter) to the introduced reference signal, which is indistinguishable from jitter from the mixer (mixer-jitter). Hence, to compensate for the mixer-jitter, the jitter contamination due to the sampling process of the converter should be not dominant over the mixer-jitter. To avoid these requirements and as a further development of the circuit of FIG. 7 the mixer-jitter compensation circuit schematic of FIG. 9 is configured as shown in FIG. 10.

Figure 10:
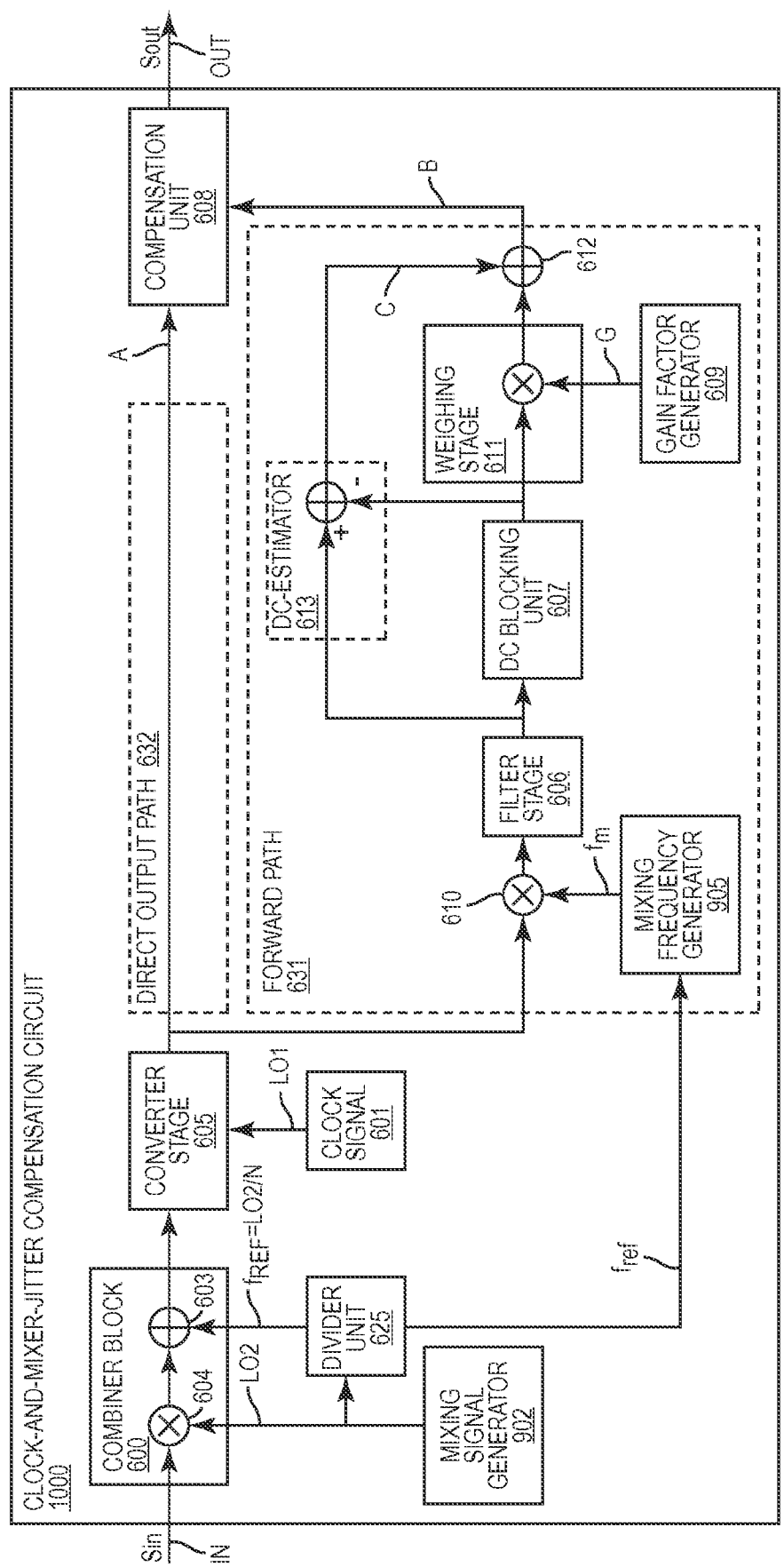
FIG. 10 shows jitter compensation circuit according to a third embodiment of the present invention, wherein the jitter may comprise clock-jitter and mixer-jitter.

With respect to FIG. 10, the shown circuit 1000 represents a possible implementation of the circuit of FIG. 9 by means of a modification or a further development of the circuit of FIG. 7. With the circuit of FIG. 10 it is possible to compensate jitter independent from its source such as clock-jitter, mixer-jitter or a combination thereof. As in FIG. 9, the input signal $S_{in}$ is first, e.g. in a receiver chain, multiplied in a combiner block 600, that comprises the second mixing unit 604, with a respective mixing frequency LO2 from a respective local oscillator 902 that generates the LO frequency LO2.

Now, the reference signal, in contrast to the embodiment of FIG. 7, is derived from the frequency LO2 by dividing it with a divider unit 625 with a factor N. A respective divider unit 625 may be for example implemented by a fractional N divider located at the input part of the circuit. Then the generated reference signal is added by means of the second adder unit 603, which is located after the mixer unit 604, to the input signal of the receiver chain.

Then, the converter system 605 processes the whole input signal, e.g. in case of an A/D-converter by digitizing. Hence, the down-mixed or down-converted input signal is processed together with the introduced reference signal having the frequency fref=LO2/N.

The converter system 605 samples at clock frequency LO1 that may again be contaminated with clock-jitter as described with the embodiment of FIG. 7.

Next, the output A of the converter stage 605 is directed to the forward path 631 of the circuit where it is processed in a similar way as in FIGS. 7 and 9, i.e. the jitter content is extracted as already described in the case of clock-jitter (FIG. 7) and mixer-jitter (FIG. 9) compensation. The clock signal, generated by the local oscillator 601, with which the converter stage 605 is being clocked may comprise also in this embodiment a jitter signal.

When extracting the jitter (signal) a copy of the output signal of the converter stage 605 is multiplied by means of the first mixer unit 610 with the mixing frequency fm, which is derived from the reference signal, i.e. in this embodiment the mixing frequency fm corresponds to the frequency LO2 divided by the constant factor N. The further steps correspond to the steps as described in connection with FIGS. 7 and 9. After gain adjustment the processed signal is multiplied with the adapted signal gain G and the estimated DC value C is added and then the compensation is performed by dividing the signal A in the direct output path by the compensating signal B as in case of FIGS. 7 and 9.

Preferably, the frequency of the reference signal (LO2/N) is configured, e.g. by means of the factor N, to be sufficiently lower than the sampling clock frequency LO1 of the converter system 605, and the jitter contribution of the converter stage 605 is reduced by the oversampling factor to a small and thus a non-dominant level. Hence, the mixer-jitter dominates and can easily be compensated by the proposed technique as indicated above.

Comparing FIGS. 9 and 10, the circuit in FIG. 10 provides several advantages:

Firstly, a clean RF input reference signal is not needed to measure the mixer-jitter of the LO signal at the mixer. Secondly, although the converter stage 605 also adds jitter to the reference signal, this jitter remains distinguishable from the mixer-jitter.

Now the steps already mentioned in connection with the embodiment of FIG. 7 and the further development of FIG. 10 above for obtaining jitter compensation are summarized. The concept aims to provide a signal in which jitter is almost compensated for.

Figure 11:
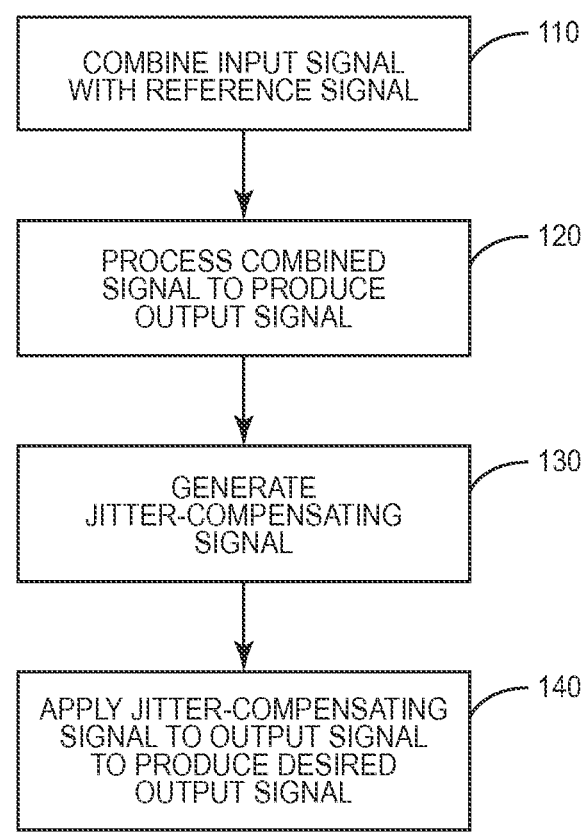
FIG. 11 shows a flowchart illustrating the jitter compensation process of the present invention.

The necessary steps are illustrated by means of a flowchart in FIG. 11.

In a first step 110, an input signal is combined with a reference signal, which may be for example derived from the frequency of a local oscillator of a mixer unit in a receiver chain for down-mixing of a receiving signal. It is noted that the term combining may comprise adding or mixing or a combination thereof. Combining of the reference signal with input signal may take place prior or after up- or down-mixing the input signal by a mixing unit in the receiver chain.

The deriving of the reference signal may comprise dividing the frequency LO2 of the local oscillator clock signal for the mixer unit by a predetermined factor N. The mixing operation may contaminate the input signal with mixer-jitter.

Then, in a next step 120, the input signal combined with the reference signal is processed, e.g. by the mentioned converting operation for the input signal together with the reference signal. Thereby, an output signal is obtained which may contain jitter, caused by clock-jitter from the processing step and/or mixer-jitter from the down-mixing operation in the receiver chain.

In a next step 130, a copy of the processed output signal is multiplied with a mixing frequency derived form the reference signal as basis for generating the jitter-compensating signal.

After the multiplying step and for the purpose of generating the jitter compensating signal the following steps may be carried out: filtering of the multiplied copy of the output signal, blocking of a DC component corresponding to the reference signal in the multiplied copy of the output signal, weighting of the multiplied copy of the output signal with a predetermined signal gain, and, finally, adding an estimated DC value C to the weighted and multiplied copy of the output signal.

Finally, in step 140, the jitter signal contained in the processed output signal in a direct output path is compensated by means of the generated jitter-compensating signal.

Hence, a desired output signal can be made almost free from jitter.

Finally, the present invention has disclosed a circuit and a method for jitter compensation in a receiver system for improving the compensation and suppression, respectively, of jitter and for improving SNR or BER performance, respectively. The jitter can be clock-jitter, mixer-jitter or a combination of both.

The disclosed jitter compensation is applicable to colored (band-limited) and white (unlimited) clock-jitter and mixer-jitter regardless of its bandwidth and the proposed jitter compensation scheme is applicable to any kind of receiver. It can be applied to any frequency range in a desired frequency band with only some minor modifications known by those skilled in the art. The invention is capable of other and different embodiments, and its several details are capable of modifications in various obvious respects, all without departing from the scope of the invention.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single circuit unit or other unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. A circuit for jitter compensation, comprising:
a combiner block including a first adder unit adding a radio frequency (RF) reference signal to an input signal of the circuit;
a converter stage configured to convert the input signal together with the reference signal, the converter stage comprising an analog-to-digital converter (ADC), the converter stage being clocked by a clock signal;
a branch configured to branch the output of the converter stage into a direct output path and a forward path;
the forward path comprising:
a first mixer unit configured to mix the output signal of the converter stage with a first mixing frequency derived from the reference signal for extracting a jitter content;
a weighting stage configured to adjust the jitter content; and
a compensation unit configured to compensate jitter in the output signal of the converter stage in the direct output path using the jitter content.

2. The circuit according to claim 1, wherein the mixing frequency corresponds to the reference signal frequency.

3. The circuit according to claim 1, wherein the combiner block further comprises a second mixer unit after the first adder unit;
   wherein the second mixer unit is configured for multiplying the input signal with a second mixing signal frequency;
   wherein the first mixing frequency corresponds to the reference signal frequency reduced by the second mixing signal frequency.

4. The circuit according to claim 1, wherein the combiner block further comprises a second mixer unit prior to the first adder unit;
   wherein the second mixer unit is configured to multiply the input signal with a second mixing signal frequency; and
   wherein the first adder unit is configured to add the reference signal to the input signal, which is derived from the second mixing signal.

5. The circuit according to claim 1, wherein the forward path further comprises:
   a filter stage configured to filter the multiplied copy of the output signal;
   DC blocking unit configured to block a DC component corresponding to the reference signal after the first mixer unit;
   second adder unit configured to add an estimated DC-value of the filtered and multiplied copy of the output signal; and
   wherein the weighting stage includes a predetermined gain for adjusting the multiplied copy of the output signal.

6. The circuit according to claim 1, wherein the analog-digital-converter comprises a sigma-delta-converter.

7. The circuit according to claim 3, wherein the second mixer unit in the combiner block comprises a digital mixer.

8. The circuit according to claim 4, wherein the reference signal is derived from the second mixing signal by means of the divider unit, which is configured to divide the second mixing signal frequency by a predetermined factor, and
   wherein the divider unit comprises a fractional N divider, where N corresponds to the predetermined factor.

9. The circuit according to claim 5, wherein the filter stage comprises a low-pass filter after the first mixer unit or a band-pass filter prior the first mixer unit or a combination thereof.

10. The circuit according to claim 8, wherein the predetermined factor corresponds to an oversampling factor of the converter stage.

11. A receiver comprising:
    a circuit configured to compensate for jitter to improve at least one of a bit-error-rate performance and a signal-to-noise ratio; the circuit comprising:
    a combiner block including a first adder unit adding a radio frequency (RF) reference signal to an input signal of the circuit;
    a converter stage configured to convert the input signal together with the reference signal, the converter stage comprising an analog-to-digital converter (ADC), the converter stage being clocked by a clock signal;
    a branch configured to branch the output of the converter stage into a direct output path and a forward path;
    the forward path comprising:
    a first mixer unit configured to mix the output signal of the converter stage with a first mixing frequency derived from the reference signal for extracting a jitter content;
    a weighting stage configured to adjust the jitter content; and
    a compensation unit configured to compensate jitter in the output signal of the converter stage in the direct output path using the jitter content.

12. The receiver according to claim 11, wherein said receiver is configured to receive one of: analog modulated signals and digitally modulated signals.

13. A method for jitter compensation, the method comprising:
    adding a reference signal to an input signal to be converted;
    converting the input signal together with the reference signal thereby obtaining an output signal, whereby the converting includes an analog-to-digital conversion;
    multiplying the output signal with a first mixing frequency derived from the reference signal for extracting a jitter content signal; adjusting the jitter content; and
    compensating jitter in the output signal with the jitter content signal.

14. The method according to claim 13, further comprising:
    generating the reference signal; and
    wherein the mixing frequency corresponds to the reference signal frequency.

15. The method according to claim 13, further comprising:
    after adding the reference signal to the input signal, multiplying the input signal with a second mixing signal frequency; and
    deriving the first mixing frequency by reducing the second mixing signal frequency by the reference signal frequency.

16. The method according to claim 13, further comprising:
    prior to adding the reference signal to the input signal, multiplying the input signal with a second mixing signal frequency; and
    deriving the reference signal from the second mixing signal frequency by dividing the second mixing signal frequency by a predetermined factor.

17. The method according to claim 13, further comprising, after multiplying:
    filtering the multiplied copy of the output signal;
    blocking a DC component corresponding to the reference signal in the multiplied copy of the output signal ;
    weighting the multiplied copy of the output signal with a predetermined signal gain; and
    adding a estimated DC-value of the filtered and multiplied copy of the output signal to the weighted and multiplied copy of the output signal.

18. The method according to claim 13, wherein the compensating of jitter in the output signal with the jitter compensating signal is performed corresponding to the following equation:

$$yresult = \frac{ysig}{C + G \cdot ycomp},$$

wherein is yresult a resulting jitter-free output signal, ysig corresponds to the input signal, ycomp corresponds to the compensating signal, C corresponds to the estimated DC value of the reference signal yref and G corresponds to a signal gain corresponding to the ratio of signal frequency fsig and reference frequency fref:

$$G = \frac{fsig}{fref}.$$

19. The method according to claim 13, wherein the jitter is caused by a clock-jitter signal and/or a mixer-jitter signal.

* * * * *